United States Patent [19]
Perlegos et al.

[11] Patent Number: 4,822,750
[45] Date of Patent: Apr. 18, 1989

[54] MOS FLOATING GATE MEMORY CELL CONTAINING TUNNELING DIFFUSION REGION IN CONTACT WITH DRAIN AND EXTENDING UNDER EDGES OF FIELD OXIDE

[75] Inventors: Gust Perlegos, Freemont; Tsung-Ching Wu, San Jose, both of Calif.

[73] Assignee: Seeq Technology, Inc., San Jose, Calif.

[21] Appl. No.: 74,085

[22] Filed: Jul. 16, 1987

Related U.S. Application Data

[63] Continuation of Ser. No. 936,965, Dec. 1, 1986, Pat. No. 4,701,776, which is a continuation of Ser. No. 527,213, Aug. 29, 1983, abandoned.

[51] Int. Cl.4 .................. H01L 27/04; H01L 27/13
[52] U.S. Cl. ................................ 437/052; 437/043
[58] Field of Search ........................... 437/43, 52

[56] References Cited

U.S. PATENT DOCUMENTS 4,203,158  5/1980  Frohman et al. .............. 357/23.5
4,426,764  1/1984  Kosa et al. ....................... 437/43
4,532,535  7/1985  Gerber et al. ................. 357/23.5

Primary Examiner—Olik Chaudhuri
Attorney, Agent, or Firm—Lyon & Lyon

[57] ABSTRACT

A two device floating gate MOS nonvolatile memory cell is disclosed including a floating gate memory device coupled to a select device wherein a thin tunnel dielectric region of insulation material between the substrate and floating gate of the memory device is located in an area above the channel of the memory device in the substrate and wherein an implanted region in the substrate to facilitate the tunneling of carriers in and out of the floating gate extends appreciably underneath the edges of the field oxide regions forming the periphery of the sides of the channel of the memory device. A select device is located in series with the memory device. A process for fabricating this memory cell is also disclosed wherein the doped tunnelling region in the substrate is defined and implanted prior to definition of the field regions.

1 Claim, 4 Drawing Sheets

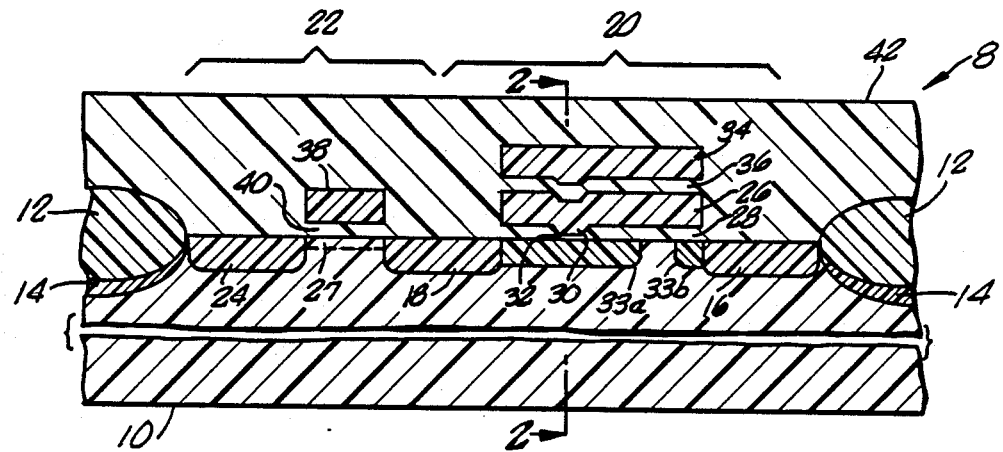
fig.1.
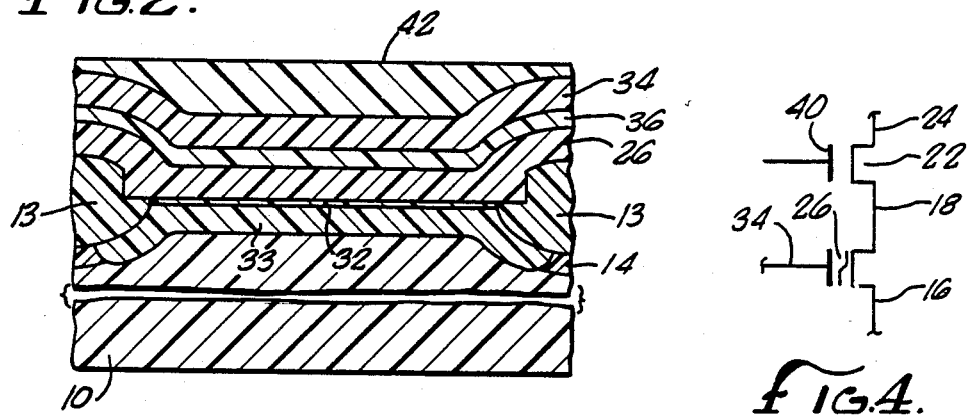
fig.2.
fig.4.
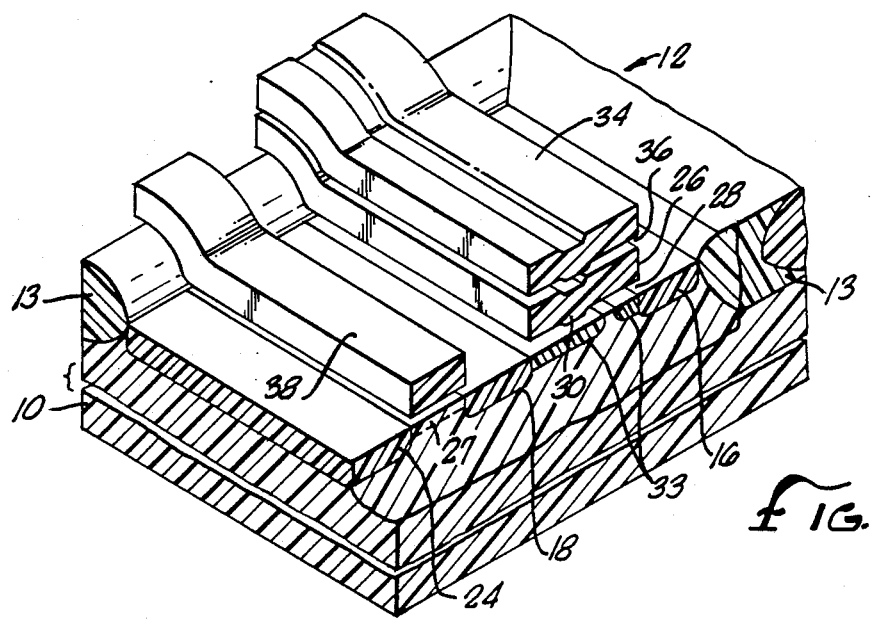
fig.3.

MOS FLOATING GATE MEMORY CELL CONTAINING TUNNELING DIFFUSION REGION IN CONTACT WITH DRAIN AND EXTENDING UNDER EDGES OF FIELD OXIDE

BACKGROUND OF THE INVENTION

1. Field of the Invention:

This is a continuation of co-pending application Ser. No. 936,965 filed on Dec. 1, 1986 now U.S. Pat. No. 4,701,776, which is a continuation of application Ser. No. 527,213, filed Aug. 29, 1983, abandoned.

The present invention relates to the field of nonvolatile electrically alterable MOS memory devices. More particularly, the invention relates to those memory devices employing MOS floating gate structures useful in MOS and CMOS memory arrays, and the process technology for fabricating such arrays.

2. The Prior Art:

Metallic oxide semiconductor (MOS) memory devices utilizing floating gates are commonly employed in integrated electrically programmable read only memory (EPROM) and electrically eraseable read only memory (EEROM) products. The presence or absence of charge on the floating gate of the memory device utilized therein alters the threshold voltage of the device, and the presence or absence of current flow in the channel of the memory device provides a suitable binary indicia for this purpose.

More specifically, thin tunnel dielectric floating gate memory devices are also known in the art. In such devices, charge carriers are transported into and out of the floating gates through a relatively thin portion of the dielectric material located between the floating gate and the device substrate via avalanche injection or Fowler-Nordheim tunneling phenomena. Examples of such devices are given in U.S. Pat. No. 4,019,197 to Lohstroh et al., U.S. Pat. No. 4,115,194 to Harari, and U.S. Pat. No. 4,203,158 to Frohman-Benchkowski.

These prior art devices have seen use in EEROM arrays, and have taught the use of a thin portion of the dielectric material separating the floating gate from an area in the device substrate which may be located either inside or outside of the channel region of the memory device, through which the charge transport mechanism is realized.

Current trends in both MOS and CMOS technology have been characterized by attempts to scale the geometries of device structures to increasingly smaller sizes, and to provide products to a user which require the external application of but a single power supply voltage (typically 5VDC), and the concomitant generation of the higher programming voltages utilized for floating gate memory devices (typically on the order of from 15 to 25 VDC) in circuitry disposed on the same silicon "chip" as the memory array which it serves.

As the MOS and CMOS technology is scaled down to smaller device sizes, thinner dielectric layers, and narrower channel widths, an increasing number of problems arise in the design and large scale fabrication of commercially-viable EEROM products, including the criticality of certain alignments and dimensions of and among the various layers comprising a completed memory cell. For the purposes of this disclosure, a memory cell is a basic unit which may be duplicated a desired number of times to be integrated with appropriate peripheral circuitry to form a memory array and includes at least a memory device and a select device.

The criticality of these smaller dimensions and of the mask-to-mask alignment tolerances which must be observed in order to optimally place the topological features of the various layers of these devices relative to one another manifests itself in the high-volume production of memory array products. The ability to reproduce critical dimensions and tolerances directly affects the yield of good parts, and hence, the economic feasibility of large-scale manufacture of memory arrays.

For example, the location of the source and drain regions of the memory device, and the location of the channel of that device with respect to the floating gate is a parameter which can affect functional characteristics of the device. In addition, the alignment of the floating gate with respect to the control gate of a memory device of this type may be important. See, e.g., U.S. Pat. No. 4,142,926 to Morgan. It has also been found that the implanted region in the substrate underlying the portion of the floating gate through which device programming and erasing occurs via the Fowler-Nordheim tunneling phenomenon must be preferentially placed with respect to topological features of later-deposited layers in a manner which assures optimum operating characteristics in the finished device and results in sufficient yields to allow large scale manufacture and sale of products embodying these memory cells.

Thus, despite the obvious advantages provided by the prior art floating gate storage devices, room for improvement of these prior art approaches remains. As a result of some of these problems which exist with current floating gate memory devices, the art has not been able to fully realize the benfits of this technology, especially where prior art techniques are applied to the shrinking geometries of today's more dense memory arrays.

OBJECTS OF THE PRESENT INVENTION

It is accordingly an object of the present invention to provide a memory device and a memory cell for use in floating gate memory arrays, and a process for fabricating these devices, which overcome some of the problems which have been present in the prior art.

It is a further object of the present invention to provide a memory device and a memory cell, as well as a process for fabricating them, which reduces the criticality of the dimensions and alignment tolerances which must be observed to achieve an acceptable yield of good devices.

Yet another object of the invention is to provide a memory device and a memory cell, as well as a process for fabricating them, which enables memory arrays containing such structures to be fabricated on a large scale with improvement in device characteristics at the smallest geometries which can be achieved using currently-available photolithography and other currently-available processing techniques.

These and other objects of the present invention realized herein will be apparent to those skilled in the art from the following specification and accompanying drawings.

SUMMARY OF THE INVENTION

A nonvolatile electrically-alterable MOS memory device and memory cell, which may be employed in both MOS and CMOS EEROM memory arrays, and a process for manufacturing them, is disclosed.

The memory cell of the present invention may be fabricated on a P-type substrate of monocrystalline silicon or the like and includes a single gate select device electrically connected in series with a floating gate memory device.

Both devices have spaced-apart N-type source and drain regions located in the substrate. The memory device has a third N-type region located in the channel region of the substrate of the memory device, electrically connected to the drain region of the memory device, and extending appreciably under the edges of the field oxide regions which define the channel edges of the device and separate it from other devices in an array. A floating gate lies above the channel region of the memory device of the present invention, separated from the substrate by a dielectric insulating layer. The portion of the floating gate which extends over the third N-type region is separated from the substrate by a portion of this dielectric insulating layer which is thinner than the remaining portions of the dielectric insulating layer. A second gate for programming is disposed above the floating gate over a dielectric insulating layer which covers the top of the floating gate.

The select device may be fabricated adjacent to the memory device and is electrically connected in series with the memory device. Its source region in the substrate may be contiguous with the drain region of the memory device. A channel region of the select device in the substrate, which may be implanted with a P-type dopant to adjust its threshold voltage, separates the source and drain regions of the select device. A control gate for the select device is located above the channel region between the source and drain regions in the substrate, and is separated from the substrate by a dielectric insulating layer. A passivation layer covers the entire structure of the memory cell, through which contacts are etched to make connections to the active regions of the memory cell for access to these regions and to facilitate fabricating arrays containing many memory cells.

When the gate of the select device turns on that device and a positive voltage is applied to the programming gate of the memory device with respect to the third region of the memory device in the substrate, charge carriers are caused to tunnel into the floating gate through the thin region of the dielectric insulative layer separating the floating gate from the substrate. A voltage of the same polarity, when applied to the third region in the substrate with respect to the top gate of the memory, causes charge carriers to tunnel out of the floating gate.

The memory cell of the present invention is fabricated by a process in which the third region in the substrate of the memory device is defined and implanted with an appropriate dopant prior to defining the field oxide channel stop regions. The active regions of the devices are then defined by the use of conventional channel stop implants and field oxide growth. The first dielectric insulating layer for the floating gate is next fabricated on the substrate and a small window preferably less than 2 microns square for the thin dielectric portion of that layer is etched therein. The thin dielectric layer is next fabricated in the window area. The floating gate is then deposited on the top of this composite dielectric layer. It is doped and then defined by masking and etching steps. The inter-gate insulating layer is next fabricated and the threshold-adjusting channel implant for the select device performed. The programming gate for the memory device is next deposited, doped and defined. This gate layer preferably also forms the control gate for the select device and other single gate MOS devices in the array periphery at this point in the process. After this gate layer has been defined the source and drain regions are defined and implanted. Vapox deposition and contact formation are then performed, as well as any other rear-end steps recognized by those skilled in the art to be necessary to fabricate an array utilizing the memory cells of the present invention.

BRIEF DESCRIPTION OF THE DRAWINGS

FIG. 1 is a cross-sectional elevation view of a memory cell fabricated in accordance with the present invention taken along the length of the channels of the memory and select devices.

FIG. 2 is a cross-sectional elevation view of the memory device of FIG. 1, taken through lines 2—2.

FIG. 3 is an isometric view of the memory call of the present invention with a portion of the field oxide omitted to facilitate illustration of the diffusions in the substrate.

FIG. 4 is a schematic representation of the electronic circuit of the memory cell of the present invention.

FIGS. 6a–6k are elevation views of a memory cell and peripheral device in a CMOS embodiment of the present invention taken along the length of the channel of the memory cell during progressive steps in the fabrication process.

Figure 5:
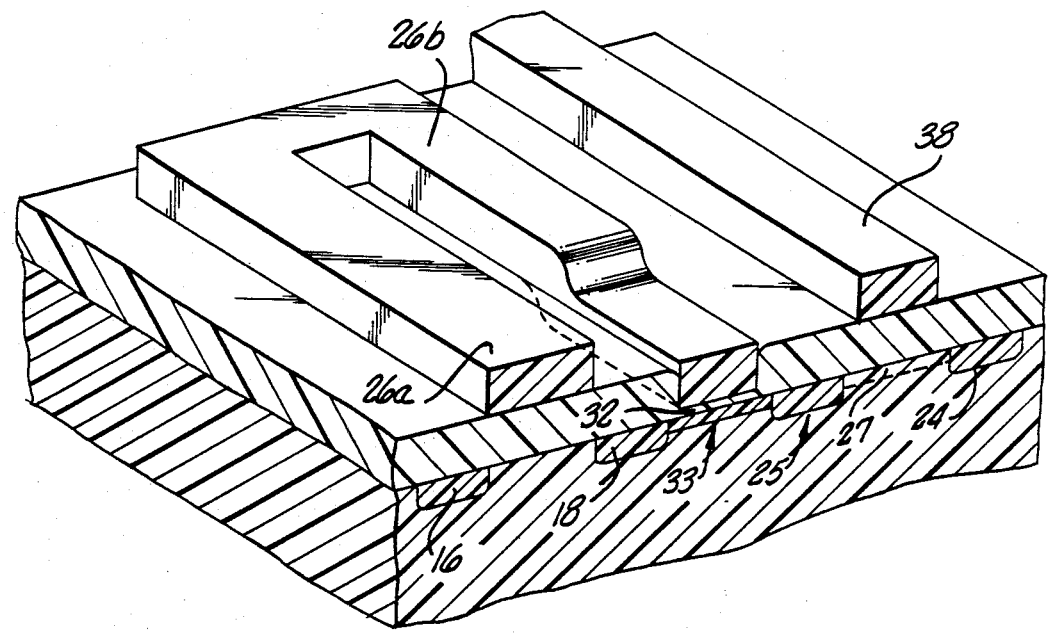
FIG. 5 is an isometric view of an alternative embodiment of a memory cell of the present invention.

Those skilled in the art will recognize that the figures are diagrammatic and not drawn to scale. Certain topological features and layer thicknesses have been exaggerated and other features and thicknesses have been illustrated at a reduced size.

DETAILED DESCRIPTION OF THE INVENTION

In the following description, numerous details such as dopants, dopant levels, etc., are given to assist in explaining the invention, although they are not necessary to practice the invention. In addition, details concerning some well-known process steps have not been included in order to avoid over-complicating the disclosure. Embodiments of the invention employ NMOS and CMOS technology.

The present invention may be practiced in a CMOS array as well as in an NMOS array. Where the process disclosed herein is to be used as a portion of a CMOS process to fabricate a CMOS memory array, it will be indicated how the steps necessary to achieve a CMOS array may be intertwined with the steps necessary to fabricate an NMOS EEROM array. The figures herein additionally illustrate the formation of P-channel peripheral devices for such an array.

The Cell

Referring first to FIG. 1, a cross-sectional elevation view of a memory cell fabricated in accordance with the present invention is depicted. For reference and to facilitate understanding the present invention, it will be seen that FIG. 1 is taken along the length of the memory and select device channels.

The memory and select devices of the present invention, together comprising a memory cell 8 of the present invention, may be fabricated on a P-type substrate 10 of monocrystalline silicon or the like, which may have a resistivity of 10–100 ohm-cm. If the present invention is to be utilized in a CMOS memory array, the substrate 10 may have a resistivity of approximately 10–20 ohm-cm.

An alternate CMOS embodiment of an array composed of memory cells of the present invention may be fabricated on a highly doped P-type substrate upon which is epitaxially grown a much more lightly-doped, thin layer of P-type silicon such as is disclosed in the article "CMOS Take a Cue From the Bipolar World", VLSI Design, Nov/Dec. 1982.

Those skilled in the art will recognize that substrate resistivity and channel doping bear a direct relationship to gate oxide thicknesses. As the gate oxide layer thickness decreases, the channel doping should increase accordingly when scaling a technology.

Since many memory devices and cells disclosed and claimed herein may be fabricated in an array, individual memory cells may be separated and electrically isolated from one another at the channel ends by conventional field oxide regions 12 and at the channel sides by conventional field oxide regions 13. As will be readily understood by those skilled in the art, "mirror" cells may be formed in order to facilitate the integration of many memory cells into an array using a minimal amount of wafer area; if this is done, channel end field oxide regions 13 will separate groups of mirror cells as is known in the art, rather than separating individual cells at the channel ends as shown in FIG. 1. Field oxide regions 12 and 13 may be thermally grown $SiO_2$, formed by conventional process steps.

Channel-stop implant regions 14 lie under field oxide regions 12 and 13, and may be formed prior to growing those regions by ion implantation of a dopant such as boron utilizing conventional process technology. Spaced-apart regions 16 and 18 in substrate region 10 form the source and drain regions respectively of memory device 20 portion of the memory cell 8. As illustrated in FIG. 1, region 18 may also function as the source of select device portion 22 of memory cell 8. Region 24 in substrate 10 forms the drain of that device. An enhancement implant 27, preferably boron, may be utilized to adjust the threshold of this device to be approximately one volt. As will be described later herein, the source and drain regions of memory and select devices 20 and 22 are formed using known masking and doping steps, the latter preferably being ion implantation of arsenic.

An electrically floating gate 26, preferably formed of polysilicon of approximately 2000–5000 angstroms in thickness, is formed above the channel region of memory device 20, between drain 16 and source 18. It is highly-doped with an N-type dopant such as phosphorus. Floating gate 26 is separated from the surface of substrate 10 by an insulating layer 28, which may be $SiO_2$ (oxide) grown in an HCl and $O_2$ atomosphere at between 1000° and 1150° C., to a thickness of from 200 to 800 angstroms.

A small region 30 of floating gate 26 is separated from substrate 10 by a thin tunnel dielectric region 32. Region 32 lies in the memory device channel and may be an oxide, oxide/nitride/oxide sandwich, ammonia annealed oxide or nitrogen annealed oxide, and may be from about 60 to 200 angstroms thick. A low temperature oxidation cycle at approximately 800° C. in an HCl and $O_2$ atmosphere, followed by higher temperature (1000° C. or greater) ammonia anneal will produce a nitrogen annealed oxide tunnel dielectric of adequate quality for use in the present invention. Region 32 is preferably formed in the shape of a square or rectangular slot. Where a rectangular slot is used which extends into field oxide regions 13, some control over etching it must be exercised to keep the area small and to avoid edge problems with implanted region 33.

A third implanted region 33 in substrate 10, electrically connected to the drain region 18 of memory device 20, lies under the floating gate, particularly under tunnel dielectric region 30. Region 33 is used for programming and erasing memory device 20. Region 33, as shown most clearly in FIG. 2, extends appreciably under the edges of field oxide regions 13. For example, where the channel widths of memory device 20 are 2 microns, this diffusion region should typically extend at least approximately 0.5 microns beyond the final edge of channel side field oxide regions 13, but not so far as to interfere with adjacent memory cells in an array.

By so locating region 33, it is assured that the resulting structure is free from any exposed N+ edges under the tunnel dielectric region. This results in an optimum N+ to substrate breakdown voltage which will be larger than the voltages required for tunneling across the tunnel dielectric region (which will be on the order of 10–12 v for a typical tunnel oxide). Unless this is done, certain mask misalignments which may occur during the manufacturing process will cause areas of low substrate to diffusion breakdown voltage around this region. This in turn will place too much of a current drain on internally-generated high voltage supplies used for programming in "5-volt only" arrays to allow byte or other block erase techniques to be used successfully, and in some cases will impair the ability to erase individual cells, thus reducing the yield of good devices.

A programming gate 34, used for programming and erasing memory device 20, is disposed above floating gate 26. Programming gate 34 may be formed of polysilicon highly-doped with phosphorus or other N-type dopant and may be from approximately 3000 to 8000 angstroms thick. Control gate 34 is separated from floating gate 26 by an insulating layer 36, which may be an oxide from about 200 to 800 angstroms thick, and which may be thermally grown in an HCl $O_2$ ambient at a temperature of from approximately 1000° to 1150° C. Insulating layer 36 may also be an oxide/nitride/oxide sandwich layer of the same approximate thickness for improved coupling. Formation techniques for such a sandwich structure are known in the art.

Select device 22 has a control gate 38, preferably formed out of the same polysilicon layer as floating gate 34 of memory device 20. Control gate 38 is separated from the surface of substrate 10 by an insulating layer 40 which may be an oxide from 200 to 800 angstroms thick. If control gate 38 is formed from the same polysilicon layer 34 comprising the floating gate, insulating layer 40 is preferably formed at the same time as insulating layer 36.

The entire structure of the memory cell is covered with a phosphorus-doped vapox layer 42 through which contacts (not shown) are made to control gates 34 and 38 and regions 24 and 16 as is known in the art. After applying and defining a metal interconnect layer, the entire surface is then covered by a passivation layer (not shown) as is known in the art.

Programming and erasing of memory cell 8 of the present invention can best be explained with reference to FIG. 4, a schematic representation of the circuit of memory cell 8.

In order to program the memory device 20, electrons are caused to tunnel into floating gate 26 from the tunnel implant region 33 in substrate 10 (FIG. 1.). Source 16 of memory device 20 is held at ground potential while node 18, the drain of memory device 20 and source of select device 22 is held to zero volts either through the select device or the memory device. A positive programming voltage in the range of approximately from 16 to 24 VDC is placed on programming gate 34 of memory device 20. The electric field thus generated across the thin tunnel dielectric is sufficient to cause electrons to tunnel into and become stored in floating gate 26.

To erase memory device 20 programming gate 34 is held at ground potential while a similar programming voltage is placed on node 18. This voltage is transferred to node 18 via select device 22 if the voltage is applied to drain 24 of select device 22 and its gate is turned on. During the erasing process, source 16 of memory device is allowed to electrically float. This condition minimizes the current drain on the programming voltage source, an important consideration where on-chip high voltage generating circuits are employed. Such circuits usually have a very limited current drive capability and any extra leakage current through one or more source 16 connections in the memory devices in an array would seriously jeopardize the ability of the high voltage generating circuit to maintain sufficient output.

While floating gate 26 may be shaped as illustrated in FIG. 3, in an alternate embodiment of the present invention floating gate 26 may be shaped as illustrated in FIG. 5.

Referring to FIG. 5, substrate 10 is shown having doped regions comprising source 16, drain 18, tunnel implant region 33 of memory device 20, and drain 24 and source 25 of select device 22. This embodiment differs from the embodiments of FIG. 3 in several respects, including a source region 25 for select device 22 which is separate from the drain of memory device 20. The tunneling diffusion region 33 connects source 25 of select device 22 with drain 18 of memory device 20.

The floating gate of this embodiment has two portions. Portion 26a is disposed over the channel of memory device 20 defined by its source 16 and drain 18, and functions as the gate of memory device 20. Portion 26b is disposed over the tunnel dielectric region 32 and is contiguous with portion 26a. The function of portion 26b is as a tunneling site for programming and erasing memory device 20.

If the embodiment of FIG. 5 is practiced the fabrication process will be slightly altered because drain 18 of memory device 22 will have to be doped prior to the deposition of programming gate 34, which will cover the substrate region in which drain 18 is located.

The Process

The memory cell of the present invention may be fabricated in a MOS process or as a process module in a CMOS process. Practice of either process does and is intended to fall within the scope of the present invention.

The process begins with wafers of monocrystalline silicon or the like having a resistivity of approximately from 15-100 ohm-cm. If the memory cell of the present invention is to be incorporated into a CMOS array, a process segment typical to conventional CMOS processes is performed. A first oxide layer approximately 4500 angstroms thick for N-well masking is grown. The N-well regions are then defined by a masking step and the oxide layer etched away. A phosphorus implant of about $5 \times 10^2$ atoms/cm$^2$ at about 100 to 150KeV is made for the N-well regions, followed by a drive-in steps which may consist of a 20 hour cycle in $N_2$ at approximately 1160° C.

Figure 6A:
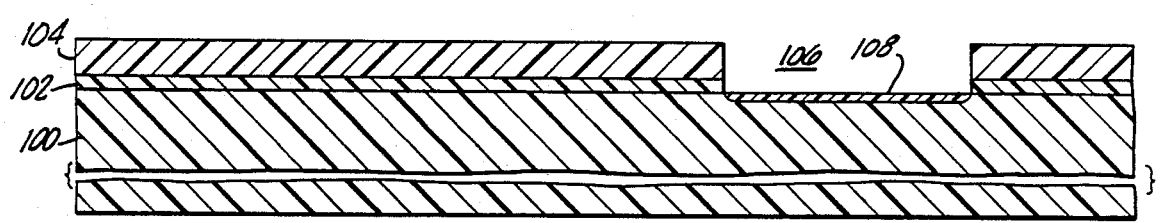

In FIG. 6a, an elevational cross-sectional view along the channel length of a memory cell and additionally including a PMOS device, P-substrate 100 can be seen after N-well masking oxide layer 102 and then photoresist mask layer 104, for defining the N-well implant window, have been applied. In FIG. 6a, N-well window area 106 is shown in photoresist layer 104. The portion of oxide layer 102 lying in the window has been etched away and an N-type dopant, such as phosphorus, has been implanted for the N-well at region 108 in the substrate 100 as is known in the art for practicing CMOS technology.

Figure 6B:
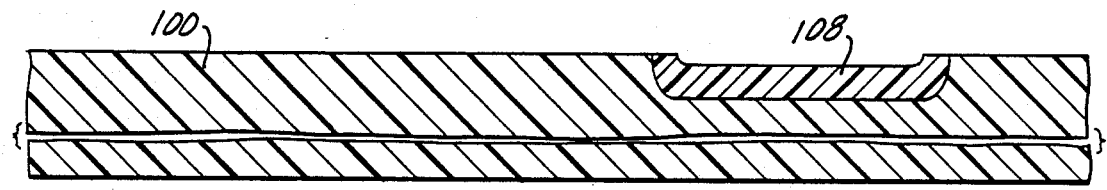

In FIG. 6b, N-well region 106 is shown lying deeper in substrate 100 after photoresist mask 104 has been stripped, the conventional drive-in step has been performed, and oxide layer 102 has been stripped away using conventional processing techniques.

In a conventional prior art MOS process the active regions, field stop implants and field oxide regions are next defined and placed on the substrate 100. Such a process cannot be used to fabricate the memory cell of the present invention. There are several reasons for this, including the impossibility of locating the tunneling region implant appreciably under the edges of the field oxide layers in a process which first defines and grows field oxide regions.

Figure 6C:
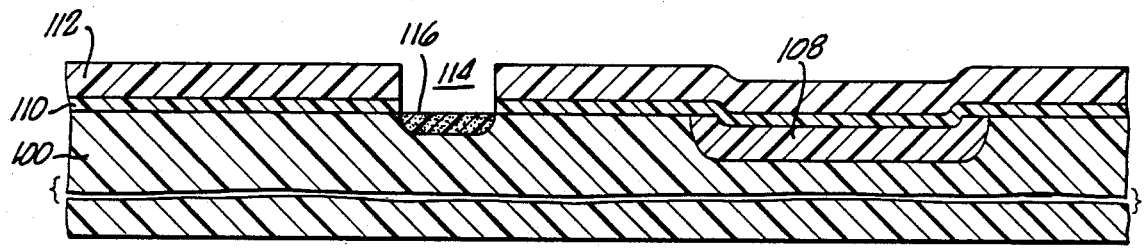

Referring now to FIG. 6c, an initial $SiO_2$ oxide layer 110 of approximately 200–700 angstroms in thickness is grown on substrate 100. Preferably this oxide layer is about 250 angstroms thick and is thermally grown in an $O_2$ and HCl atmosphere at a temperature of from approximately 800° to 1100° C., although those skilled in the art will understand that other growth parameters or methods may be used. A photoresist masking layer 112 has been deposited on the oxide surface. Masking layer 112 defines a tunnel implant window area 114. As can be seen from FIG. 6c, the portion of oxide layer 110 in window area 114 is next etched away. Known chemical etching methods may be employed, although when this process is applied to smaller geometry features, i.e. 2 micron gates, plasma etching is preferred. An N-type dopant implant, preferably an arsenic implant of between approximately $5 \times 10^{13}$ and $3 \times 10^{14}$ atoms/cm$^2$, is performed in window area 114 to form the tunnel implant region 116. In a preferred embodiment an implant dose of about $1.5 \times 10^{14}$ atoms/cm$^2$ at approximately 50 KeV is used.

Figure 6D:
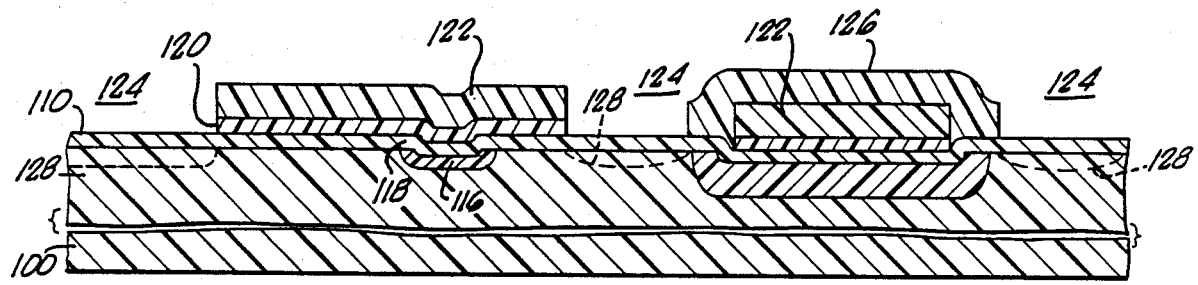

Referring now to FIG. 6d, after implanting tunnel implant region 116 and stripping away photoresist masking layer 112, a layer of oxide 118 is regrown above region 116. In a preferred embodiment, layer 118 is about 400 angstroms thick and may be grown at about 900° C. in steam. A silicon nitride layer 120 approximately 1000 angstroms thick is next deposited over the oxide layer comprising initial oxide layer 110 and oxide layer 118 using conventional processing techniques. A photoresist masking layer 122 is placed on the surface of the nitride layers to define diffusion region windows 124, and the nitride layer 120 is etched, preferably by plasma etching techniques.

Next, the field stop implant windows 124 are defined by a second photoresist masking layer 126, which is preferably applied while photoresist layer 122 is still in place. Photoresist mask layer 122 helps to partially define these window areas 124 if a CMOS embodiment of the invention is being practiced and saves a resist stripping step to allow for greater process throughput. Layer 122 alone functions to define field stop implant windows 124 in an NMOS embodiment. Next the field stop implant regions 128 are implanted, preferably with boron, to a concentration of from about $1 \times 10^{13}$ to $5 \times 10^{13}$ atoms/cm$^2$. In a preferred embodiment, an implant dose of about $2 \times 10^{13}$ atoms/cm$^2$ at approximately 100 KeV is used. FIG. 5d illustrates the point in the process following the boron implant in regions 128 of the substrate.

Figure 6E:
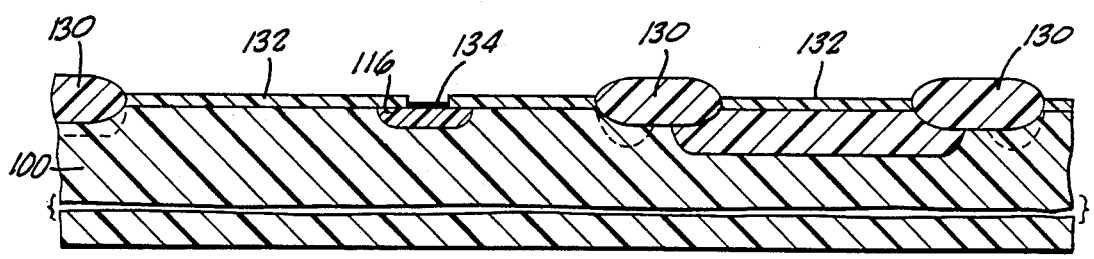

Referring now to FIG. 6e after photoresist mask layers 122 and 126 have been stripped away, field oxide regions 130, approximately 0.8–1.4 microns thick are grown, preferably by thermal oxidation in steam, at temperatures of between approximately 900°–1000° C. In a preferred embodiment, about 1.25 microns may be grown at about 940° C. in steam. Oxide layers 110 and 118 and nitride layer 120 are then stripped by known chemical etching techniques to expose the bare silicon substrate 100, and then a first gate SiO$_2$ oxide layer 132 is thermally grown to a thickness of between approximately 200–1000 angstroms, preferably in a HCl and O$_2$ atmosphere at a temperature of from approximately 1000° to 1150° C. In a preferred embodiment, oxide layer 132 is grown to about 400 angstroms. A photoresist layer (not shown) is next placed on the surface of oxide layer 132 to define a window for the formation of the tunnel dielectric region to be located above the tunnel implant region in the substrate. The portion of oxide layer 132 in this window is then etched away. The photoresist layer is then stripped and a tunnel dielectric 134 is grown on the substrate and covers this window area. Preferably a low temperature (approximately 800° C.) cycle in a HCl/O$_2$ ambient is utilized, followed by an ammonia anneal at above 1000° C. to form a dielectric approximately 60–150 angstroms thick. In a preferred embodiment, about 75 to 85 angstroms of oxide is grown and annealed in NH$_3$ approximately 1050° C. for approximately 5 minutes. FIG. 6e shows the structure resulting after the tunnel dielectric region 134 has been grown.

Figure 6F:
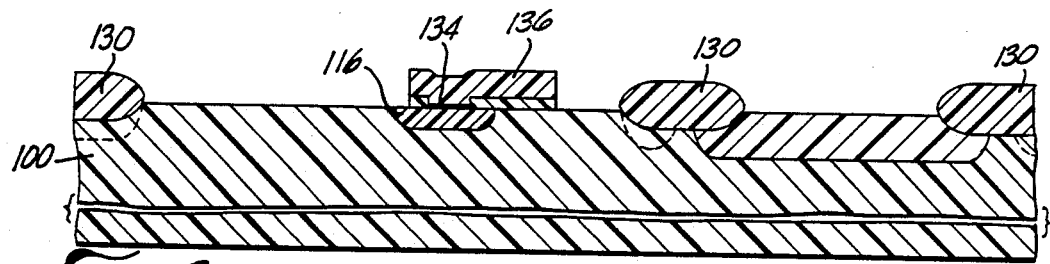

A layer of polysilicon 136 which is to form the floating gate of the memory device is deposited on the surface of first gate oxide 132 and tunnel dielectric 134. This layer may be approximately 2000–5000 angstroms thick, and is heavily doped with an N-type dopant, preferably with phosphorus, either during or after deposition, yielding a typical sheet resistance of approximately 20–50 ohms/sq. In a preferred embodiment, about 3700 angstroms of polysilicon is deposited by LPCVD techniques at about 650° C. and POCl$_3$ doped at about 1000° C. to yield a V/I of about 9 ohms on a test wafer. A layer of oxide about 550 angstroms thick (not shown) may next be grown on top of polysilicon layer 136 to promote adhesion of a photoresist layer (not shown) which will next be applied as a mask to define the periphery of polysilicon layer 136, which forms the floating gate for the memory device of the present invention. After the mask is applied, polysilicon layer 136 is defined by etching, preferably plasma etching. As noted previously, in a preferred embodiment of the present invention, the periphery of polysilicon layer 136, as defined by the photoresist mask, is everywhere outside the boundaries of the slot which forms the site for the thin tunnel dielectric region. This geometry prevents a polysilicon etch from taking place over the thin dielectric region and the accompanying risk of damaging the integrity of the dielectric film which is critical to device operation and longevity. The photoresist layer is then stripped and the exposed portions of first gate oxide layer 132 are dipped out by conventional techniques, leaving the structure depicted in FIG. 6f.

Figure 6G:
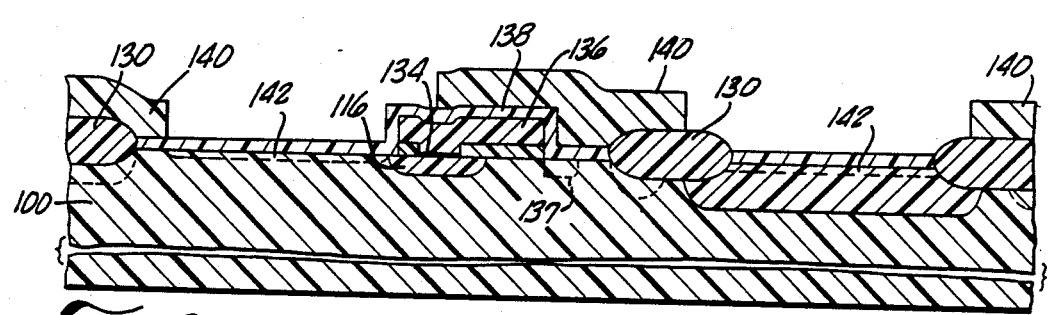
Figure 6H:
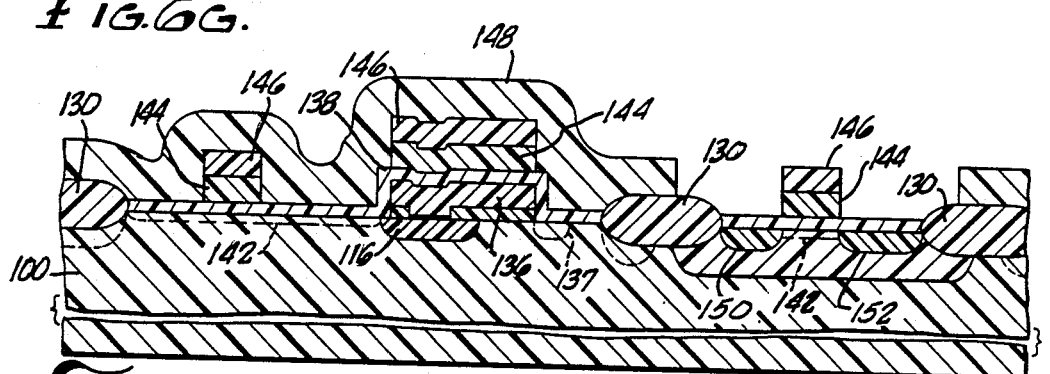

Referring again to FIG. 1, it can be seen that tunnel implant region 33 may consist of two segments, 33a and 33b. Segment 33a is located adjacent to and in contact with drain 18 of memory device 20. Segment 33b may be located adjacent to and in contact with source 16 of memory device 20. The present invention may be practiced using only region 33a formed as described herein and shown in FIG. 3. Region 33b, however, may be formed later in the process sequence, after the shape of the first polysilicon layer which forms the floating gate has been defined and after oxide layer 132 of FIG. 6e has dipped out. This implanted region is shown in FIG. 6g at 137.

Those skilled in the art will recognize that the space between diffusion regions 33a and 33b define the channel length of memory device 22. This later implant of region 33b after the definition of the shape of the floating gate provides a significant advantage when fabricating memory cells of the present invention.

In the process disclosed herein, self-aligned gate formation techniques are not necessary. Thus, there is the possibility that misalignments of the masking layer used to define the shape of programming gate 34 with respect to the edge of floating gate 26 will result in formation of a parasitic device having a gate formed of programming gate 34 over any portion of the channel extending beyond the edge of floating gate 26. By performing an implant of region 33b using the edge of floating gate 26 as a mask, and masking out all other regions of the wafer with an additional photoresist mask, a channel region for a parasitic transistor formed due to any misalignment between floating gate 26 and programming gate 34 is prevented from existing. A preferred embodiment this implant may be performed to a concentration of $3 \times 10^{14}$ atoms/am$^2$ at an energy of about 80KeV.

If the embodiment of FIG. 5 is being practiced, the drain region 18 of memory device 22 of FIG. 4 is doped after the definition of the floating gate since this region will be inaccessable after the second polysilicon layer for programming gate 34 has been deposited. An additional photomask defines a window area for drain 18 and it is doped using the same process for creating the remaining source/drain diffusions in this process.

An additional implant for tunnel region 33 is also performed at this time using the floating gate portion 26b as a mask and masking the remainder of the wafer surface with an additional photomask. This step assures that drain 18 of memory device 22 will be electrically connected to source 25 of select device 20 via diffusion region 33 as illustrated in FIG. 5.

Referring now to FIG. 6g, an oxide layer 138 is grown over the wafer surface to a thickness of from approximately 200 to 1000 angstroms in an HCl/O$_2$ ambient at a temperature of approximately from 1000° to 1150° C. In a preferred embodiment, a 400 angstrom thick layer is grown in an O$_2$/N$_2$/HCl or O$_2$/Ar/HCl atmosphere. If an NMOS embodiment of the present invention is being practiced, some peripheral devices will be depletion devices. These devices will receive a threshold-adjusting depletion implant, preferably arsenic, prior to the growing of oxide layer 138. Those skilled in the art will realize that the magnitude of the implant will depend on the desired depletion current of the device.

A layer of photoresist 140 is next placed on the top of the oxide layer 138 to serve as a mask for the enhancement implant for the select device of the memory cell and for the P-type devices and N-channel enhancement devices in the periphery. FIG. 6g depicts the structure after the enhancement implant has been performed. The implanted regions 142 are implanted preferably with boron to a level of from approximately $2 \times 10^{11}$ to $1.2 \times 10^{12}$ to atoms/cm$^2$, and the layer of photoresist 140 is then stripped away. In a preferred embodiment, an implant dose of about $8.5 \times 10^{11}$ atoms/cm$^2$ at about 50 KeV is used.

The second layer of polysilicon 144 is next deposited on oxide layer 138, and highly doped with an N-type dopant, preferably phosphorus, as is the first polysilicon layer either during or after deposition. This polysilicon layer forms the control gate of the memory device of the memory cell of the present invention and preferably forms the control gates of the select device and peripheral devices in an array of such cells. In a preferred embodiment, this layer is about 4500 angstroms thick. Those skilled in the art will realize that the first layer of polysilicon 136 could also be used to form the control gate 144 of the select device and the control gates of peripheral devices in the array resulting in different mask geometries and slightly different process steps.

A photoresist layer 146 is placed over the polysilicon layer 144. Layer 144 may first have a layer of oxide grown on its upper surface to promote adhesion of the photoresist to the surface as was done with the first layer. Photoresist layer 146 is used as a mask to define the shape of polysilicon layer 144. With this photoresist mask 146 in place, the polysilicon layer 144 is etched to define its shape. While chemical etching techniques will perform satisfactorily on relatively large geometries, anisotropic plasma etching is preferred, especially for the smaller geometries encountered in today's leading edge memory technology. The oxide layer 138 is then dipped out in preparation for the source/drain implant steps.

At this stage in the process, if a CMOS embodiment of the invention is being practiced, a photoresist layer 148 is placed on the wafer as a mask to define the P+ source and drain implant regions 150 and 152 respectively in the N-well region 108. Photoresist mask layer 146 is preferably left on place on the wafer in order to save the stripping and cleaning steps which would otherwise be required prior to application of photoresist mask layer 148. This allows for faster processing throughput and prevents boron or other dopant from getting into the polysilicon gate of the P-device, which prevents threshold instability problems. The PMOS source and drain regions 150 and 152 are next implanted with a P-type dopant, such as boron to a concentration of approximately $5 \times 10^{14}$ to $4 \times 10^{15}$ atoms/cm$^2$. In a preferred embodiment, an implant dose of about $1.5 \times 10^{15}$ atoms/cm$^2$ at about 50 KeV is used. FIG. 5h shows the structure after the P+ source drain implant has been performed and prior to stripping of the photoresist layers 146 and 148.

Figure 6I:
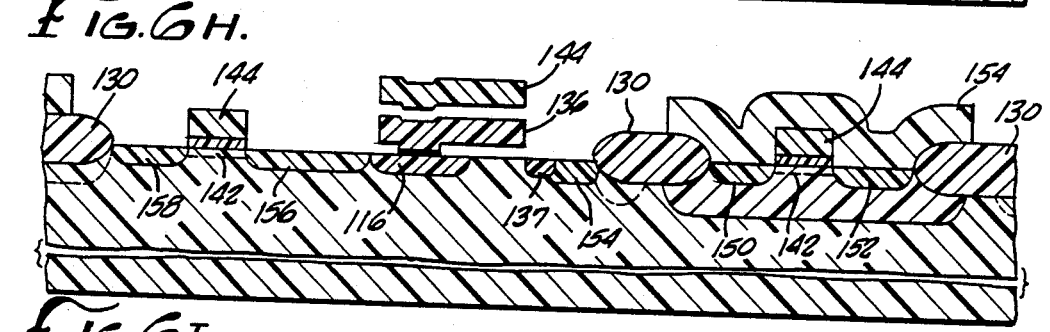

Next, as shown in FIG. 6i, a photoresist layer 154 is applied to the wafer to function as a mask cover P+ diffusion regions on the wafer surface and to define the N+ source and drain regions for 154, 156, and 158 for the cell as well as all of the NMOS devices on the wafer. Arsenic is implanted to a concentration of from approximately $1 \times 10^{15}$ to $2 \times 10^{16}$ atoms/cm$^2$. In a preferred embodiment, an implant dose of about $4 \times 10^{15}$ atoms/cm$^2$ at about 80 KeV is used. Those skilled in the art will recognize that spin-on arsenic or phosphorus diffusion would suffice for doping the N+ source drain regions.

If an NMOS embodiment of the present invention is being practiced, after the step which etches polysilicon layer 144, the gate oxide and oxide overlying layer 144 would be dipped out and the $N^{30}$ source drain regions implanted using layer 144 as a mask, thus eliminating the N+ source/drain masking step.

After the $N^{30}$ source/drain regions have been implanted, a layer of oxide is regrown over all of the bare silicon areas where the second gate oxide 138 had been removed prior to source drain implantation. This refill oxide layer 160 is grown to a thickness of at least about 300 angstroms in a pure $O_2$ ambient or, in the NMOS embodiment, an $O_2$ or a steam ambient at a temperature of between approximately 850° to 1000° C. In a presently preferred embodiment about 300 angstroms is grown in $O_2$ at approximately 950° C.

Figure 6J:
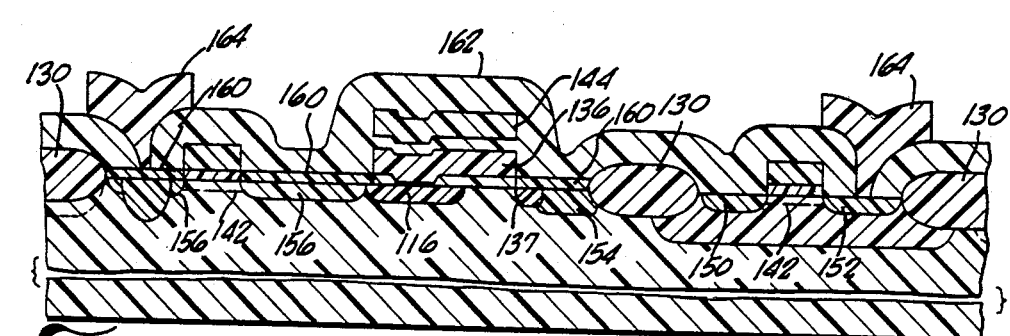

Referring now to FIG. 6j, a phosphorus-doped glass layer 162 is next deposited on the wafer surface and contact holes are etched in the layer after it has been subjected to an elevated temperature flow step as is known in the art. Those skilled in the art will know the difference and sequence involved in forming contact holes, reflowing the glass and depositing, defining, and etching the aluminum-silicon contacts and pads shown at 164. FIG. 6j shows the substantially completed structure before the deposition of a passivation layer to protect the devices (not shown).

The remaining steps necessary to achieving a completed device, e.g., final passivation, gold deposition, etc., are well known in the art and will not be treated in this specification.

While two specific embodiments of the present invention have been disclosed along with several process embodiments, variations will suggest themselves to those skilled in the art from the teachings of the specification and drawings herein. They are intended to fall within the scope of the present invention, which is limited only by the appended claims.

What is claimed is:

1. A process for fabricating a nonvolatile MOS memory device including the steps of:

first defining and doping a tunneling diffusion region in a semiconductor substrate, forming four opposed field oxide regions to define a four-sided active field effect transistor region in an area on said substrate which includes said tunneling diffusion region such that said tunneling diffusion region lies appreciably under the edges of two opposing ones of said field oxide regions, forming a first layer of dielectric material on top of said active field effect transistor regions, having a relatively thin portion therein disposed entirely over said tunneling diffusion region, forming a first gate electrode on top of said first layer of dielectric material, extending entirely over said thin portion, forming a second layer of dielectric material over and around said first gate electrode to electrically insulate said first gate electrode, forming a second gate electrode on top of said second layer of dielectric material, disposed entirely over said first gate electrode, forming source and drain regions in said active field effect transistor region at locations such that said tunneling diffusion region is in physical contact with said drain region and said tunneling diffusion region lies along the length of a channel formed by said source and drain regions.

* * * * *